US011846648B2

(12) United States Patent
Thompson et al.

(10) Patent No.: US 11,846,648 B2
(45) Date of Patent: Dec. 19, 2023

(54) LOW STRESS OVERTRAVEL STOP

(71) Applicant: INVENSENSE, INC., San Jose, CA (US)

(72) Inventors: Matthew Julian Thompson, Beaverton, OR (US); Robert Walmsley, Cupertino, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/647,376

(22) Filed: Jan. 7, 2022

(65) Prior Publication Data

US 2023/0221345 A1    Jul. 13, 2023

(51) Int. Cl.
*G01P 15/08* (2006.01)

(52) U.S. Cl.
CPC ...... *G01P 15/08* (2013.01); *G01P 2015/0871* (2013.01)

(58) Field of Classification Search
CPC ............. G01P 15/08; G01P 2015/0871; G01P 2015/0874
See application file for complete search history.

(56) References Cited

U.S. PATENT DOCUMENTS

| 10,527,420 | B2  |   | 1/2020 | Qiu et al. |             |
|------------|-----|---|--------|------------|-------------|
| 2002/0027191 | A1 | * | 3/2002 | Min | G01B 7/003 |
|            |     |   |        |            | 250/231.13 |
| 2019/0092619 | A1 | * | 3/2019 | Herzogenrath | G01P 15/0802 |
| 2019/0120872 | A1 | * | 4/2019 | Geisberger | G01P 15/125 |

* cited by examiner

*Primary Examiner* — Natalie Huls
*Assistant Examiner* — Cynthia L Davis
(74) *Attorney, Agent, or Firm* — Amin, Turocy & Watson, LLP

(57) ABSTRACT

A microelectromechanical system device is described. The microelectromechanical system device can comprise: a proof mass coupled to an anchor via a spring, wherein the proof mass moves in response to an imposition of an external load to the proof mass, and an overtravel stop comprising a first portion and a second portion.

11 Claims, 6 Drawing Sheets

LOW STRESS OVERTRAVEL STOP

TECHNICAL FIELD

The subject disclosure provides improvements to stiction lifetime robustness in regard to low stress overtravel stops.

BACKGROUND

Lifetime stiction can be a primary concern for customers of microelectromechanical systems (MEMS) devices. Known issues with MEMS devices are that upon experiencing shocks, these devices can undergo chipping at corners when moving structures contact a target. This can lead to undesirable effects, shortening the lifetimes of MEMS devices and increasing costs and other unforeseen deterioration. Overtravel stops (or bumpstops) have typically been used to reduce the impact experienced by MEMS devices.

For lifetime stiction testing, overtravel stops can be subjected to approximately 100,000 impacts. These impacts can degrade any anti-stiction coatings that can have been applied to the overtravel stops and can consequently lead or result in stiction.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with various embodiments set forth herein, the subject disclosure provides a microelectromechanical system device, comprising: a proof mass coupled to an anchor via a spring, wherein the proof mass moves in response to an imposition of an external load to the proof mass, and an overtravel stop comprising a first portion and a second portion. In various embodiments, when the proof mass contacts the first portion of the overtravel stop and the proof mass becomes can disengage from the second portion of the overtravel stop in response to the external load being above a first threshold value and below a second threshold value. Further, when the proof mass contacts the second portion of the overtravel stop and the proof mass can disengage from the first portion of the overtravel stop in response to the external load exceeding the second threshold value. Additionally, the proof mass moves in a first direction in response to the external load being less than a first threshold value, and the proof mass moves in a second direction when the external load exceeds the first threshold value. Furthermore, the first direction can be a first translation or first rotation, and the second direction can be a second translation or a second rotation. In addition, the first direction can be substantially and/or approximately orthogonal to the second direction.

Additionally, the overtravel stop can be located on an axis of the second direction, and the proof mass can be asymmetric about an axis of the second direction. Moreover, the second portion of the overtravel stop can be curved and can have an aspect ratio greater than 1:5. In some embodiments, a surface of the overtravel stop can comprise any of silicon, titanium, germanium, silicon oxide, silicon nitride, tungsten, or titanium nitride. In addition, the microelectromechanical system device can comprise a first sensor and a second sensor, wherein the first sensor measures a first motion of the proof mass in a first direction, and wherein the second sensor measures a second motion of the proof mass in a second direction.

In accordance with additional and/or alternative embodiments the subject disclosure provides a microelectromechanical system device, comprising: a first proof mass coupled to an anchor via a first spring, a second proof mass coupled to the first proof mass via a second spring, wherein the first proof mass and the second proof mass moves in response to an imposition of an external load, and an overtravel stop comprising a first portion and a second portion.

In certain embodiments, the second proof mass can contact the first portion of the overtravel stop and the second proof mass can be disengaged from the second portion of the overtravel stop in response the external load being above a first threshold value and below a second threshold value. Further, the second proof mass can contact the second portion of the overtravel stop and the second proof mass can disengage from the first portion of the overtravel stop in response to the external load being above the second threshold. Furthermore, the first proof mass and the second proof mass can move in a first direction when the external load is less than a first threshold value, and the second proof mass can move in a second direction in response to the external load exceeding the first threshold value. Additionally, the first direction can be a first translation or a first rotation, and the second direction can be a second translation or a second rotation, such that the first direction is substantially orthogonal to the second direction.

In some embodiments the overtravel stop can be located on a first axis associated with the first direction, and/or the overtravel stop can be located on a second axis associated with the second direction. In certain embodiments the first proof mass can be asymmetric about the second axis. In additional and/or alternative embodiments the microelectromechanical system device can further comprise a first sensing element device and a second sensing element device, wherein the first sensing element device measures a first motion of the first proof mass in the first direction, and the second sensing element device measures a second motion of the second proof mass in the second direction.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present disclosure will be apparent upon consideration of the following detailed description, taken in conjunction with the accompanying drawings, in which like reference characters refer to like parts throughout, and in which.

DETAILED DESCRIPTION

Figure 1:
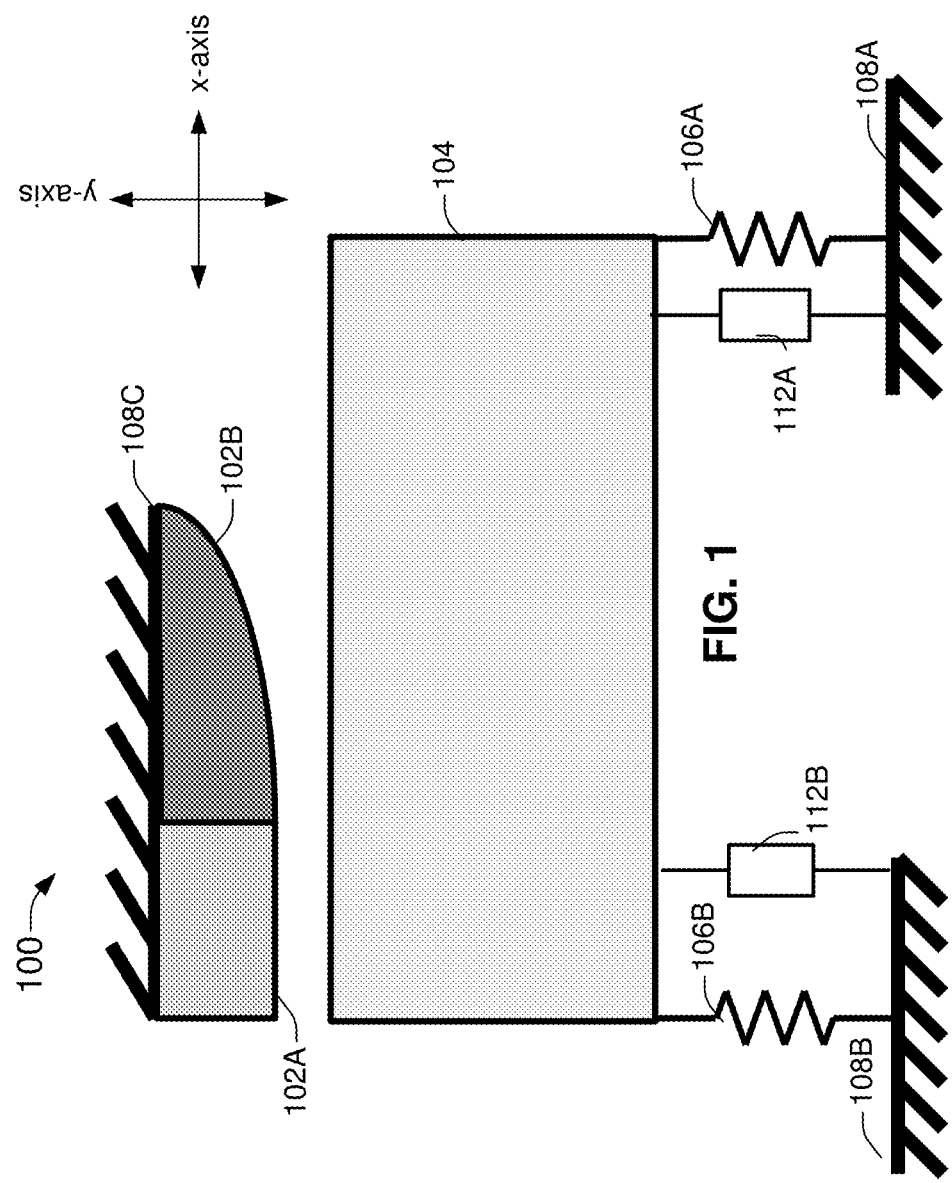
FIG. 1 illustrates a low stress overtravel stop, in accordance with various embodiments set forth in this disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

FIG. 1, in accordance with various embodiments, depicts an illustrative embodiment 100 of a low stress overtravel stop (e.g., low stress elastic bump, or low stress bump stop) that can comprise a first portion 102A and a second portion 102B. Typically, multiple low stress overtravel stops can be associated with a MEMS device. For purposes of the herein exposition, the first portion 102A and the second portion 102B of the low stress overtravel stop or low stress bump stop, on occasion can collectively be referred to as overtravel stop 102 or bump stop 102. While overtravel stop 102 or bump stop 102 has been depicted as comprising two portions (e.g., first portion 102A and second portion 102B), overtravel stop 102 or bump stop 102 can comprise more than two portions, and some embodiments can have multiple facets.

Also depicted in illustrative embodiment 100 is a proof mass (PM) 104 that can be coupled to a first anchor point 108A and a second anchor point 108B. The proof mass 104 can be coupled to the first anchor point 108A via a first elastic object that stores mechanical energy 106A, such as a first spring. The proof mass 104 can also be coupled to the second anchor point 108B via a second elastic object that stores mechanical energy 106B, such as a second spring.

Additionally, as illustrated in embodiment 100, the overtravel stop 102 can be affixed to a third anchor point 108C. In regard to affixing the overtravel stop 102 to the third anchor point 108C various reactive and/or nonreactive adhesives and/or attachment mechanisms can be utilized, such as various resins, mechanical fasteners, and the like.

In some embodiments, overtravel stop 102 can be affixed to the third anchor point 108C via the first portion 102A of the overtravel stop. In other embodiments, overtravel stop 102 can be affixed to the third anchor point 108C via both the first portion 102A and the second portion 102B of the overtravel stop. In yet further embodiments, overtravel stop 102 can be affixed to the third anchor point 108C via the second portion 102B of the overtravel stop 102.

As noted earlier, overtravel stop 102 can comprise a first portion 102A and a second portion 102B. In some embodiments, the first portion 102A of the overtravel stop 102 can be substantially planar in a direction approximately orthogonal to a motion of the proof mass 104 when the proof mass 104 is initially set in motion. For instance, where proof mass 104 is initially set in motion around a first axis (e.g., an x-axis) the substantially planar first portion 102 of the overtravel stop 102 can be aligned approximately parallel to an edge of the proof mass 104 as the proof mass 104 moves around the first axis.

It will be noted with regard to FIG. 1 that the proof mass 104 when at rest and/or when initially set in motion is not in contact with any portion of the overtravel stop 102. In particular, proof mass 104 at rest and/or when initially set in motion is typically not in contact with either the substantially planar first portion 102A of overtravel stop 102 or the second portion 102B of overtravel stop 102.

In regard to the second portion 102B of overtravel stop 102 it will be observed that this portion of overtravel stop 102 can be formed or shaped to match to one or more polynomial function representing at least a group of constants and at least a group of variables. Thus, the shape of the overtravel stop 102 inclusive of the first portion 102A and the second portion 102B can be an approximately planar first part (e.g., first portion 102A) that seamlessly transitions into a shape that corresponds (e.g., is substantially consistent) with one or more generated polynomial function comprising one or more constant numeric values and/or one or more variable numeric values. For reasons that will subsequently become apparent, the polynomial function can be selected from one or more groupings of polynomial functions that can ensure that as proof mass 104 moves and gains in acceleration rotating about a first axis the proof mass 104, once it contacts the substantially planar face of the first portion 102A, it will rapidly migrate, due to the increasing acceleration of the proof mass 104 about its axis of rotation, from the substantially planar surface of the first portion 102A of the travel stop 102, traverse the more curvilinear surface of the second portion 102B of the overtravel stop 102, and ultimately free itself from the surface (e.g., both surface of the first portion 102A and the surface of the second portion 102B) of the overtravel stop.

In regard to the surface of the overtravel stop 102 (e.g., first portion 102A and/or second portion 102B) can comprise any of silicon, poly-silicon, titanium, germanium, silicon oxide, silicon nitride, tungsten, and titanium oxide. Further in relation to the curvilinear surface of the second portion 102B of the overtravel stop 102, the curvilinear surface can have an aspect ratio that can be approximately equal to or greater than 1:5.

As will be observed by those of ordinary skill, as poof mass 104 transitions from the substantially planar surface comprising the first portion 102A to the more curvilinear surface comprising the second portion 102B, the edge of the proof mass 104, when it comes into contact with the curvilinear surface of the second portion 102B, can have a point contact with the curvilinear surface of the second portion 102B. More particularly, when the edge of proof mass 104 is in contact with the curvilinear surface of the second portion 102B of the overtravel stop 102, the contact point can be a tangential point on the curvilinear surface that can be determined as the result of differential of the one or more polynomial function that can have been used to form the curvilinear surface of the second portion 102B. In contrast, when the edge of proof mass 104 contacts the substantially planar first portion 102A of the overtravel stop 102, the result of a differential of the substantially planar surface should tend to be approximately zero.

By using an overtravel stop comprising a first portion 102A that has a surface that can be relatively planar and a second portion 102B that can have a curvilinear surface that conforms to one or more polynomial function stiction can be avoided, reduced, and/or mitigated. Stiction is typically an undesirable situation which can arise when surface adhesion forces are higher than the mechanical restoring force of a MEMS structure or MEMS device. Stiction is recognized to often occur in situations where two surfaces with areas in close proximity come in contact. The greater the contact area at both macroscopic and microscopic roughness levels, the greater the risk of stiction. At a microscopic level, soft materials can deform, effectively increasing contact area. Surfaces can be unintentionally brought into contact by external environmental forces including vibration, shock and surface tension forces that can be present, for example, during aqueous sacrificial release steps often used in microfabrication processes. Adherence of the two surfaces can occur causing the undesirable stiction.

In the embodiment depicted in FIG. 1 it should be noted the proof mass 104 has not be set in motion through the imposition of an external load, and as such proof mass 104 is not in contact with the overtravel stop 102. Further, it should also be noted that in many embodiments the overtravel stop 102 can be situated on one or more axes (e.g., x-axis, y-axis, z-axis). Also it should be observed, that, multiple sensing elements, or multiple sensing devices, can be situated proximately to proof mass 104 to measure the motion of proof mass in the one or more axes. For example, as depicted in FIG. 1, a first sensing element or sensing device 112A can be located between proof mass 104 and an anchor point 108A, and a second sensing element or sensing device 112B can be situated between proof mass 104 anchor 108B. Additionally, it should be noted that proof mass 104 can be asymmetric in one or more direction.

Figure 2:
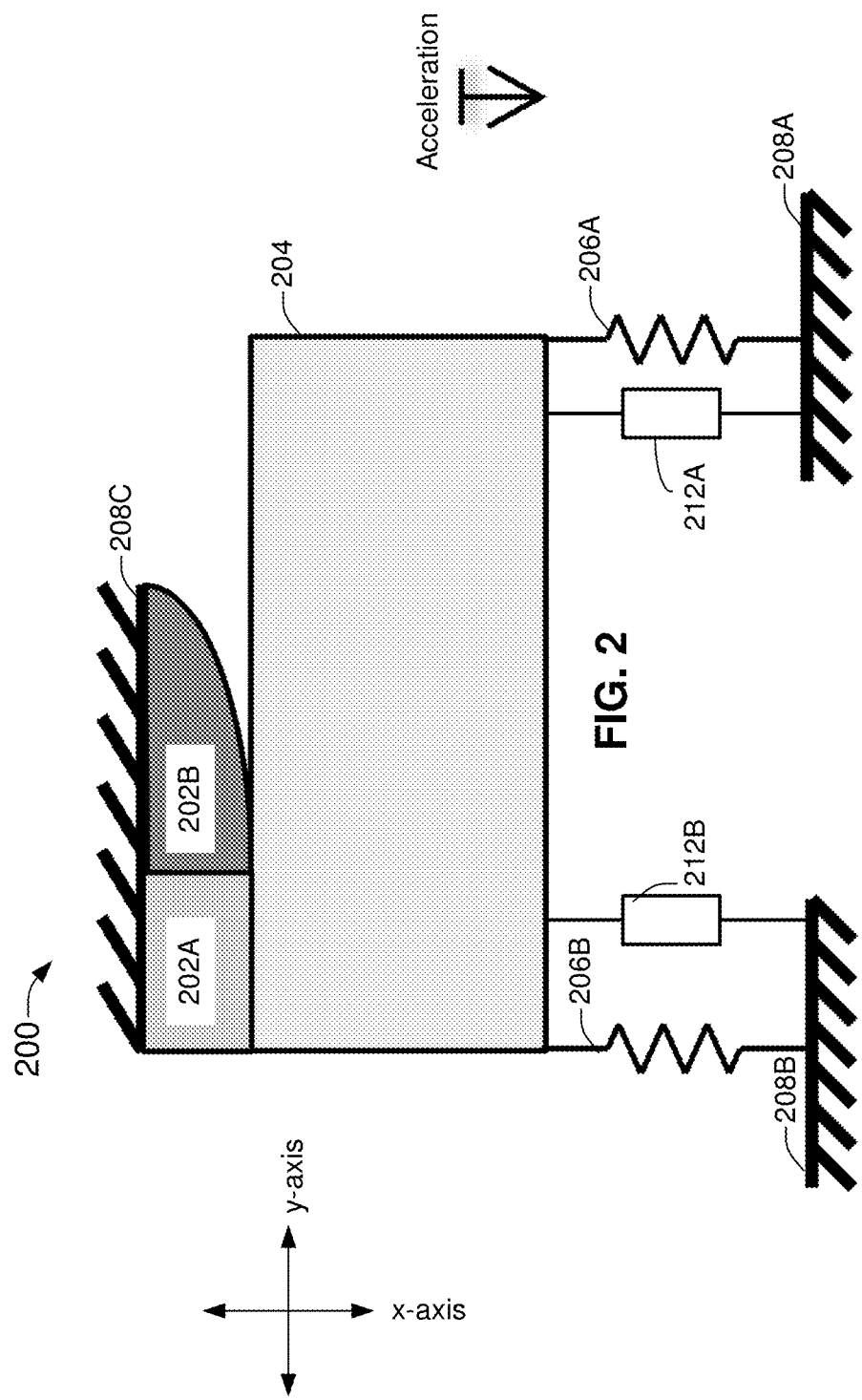
FIG. 2 provides additional depiction of a low stress overtravel stop, in accordance with various embodiments set forth in this disclosure.

FIG. 2 provides additional illustration of an illustrative embodiment 200 of the low stress overtravel stop that can comprise a first portion 102A and a second portion 102B (now respectively labeled overtravel stop 202 first portion 202A and second portion 202B). As noted above, multiple low stress overtravel stops, such as overtravel stop 202, can be associated with a MEMS device. In this depiction it will be observed that an edge of the proofmass 204 has contacted overtravel stop 202 on the approximately planar surface of the first portion 202A. The edge comprising the overtravel stop 202 can have come in contact with the approximately planar surface of the first portion 202A of the overtravel stop 202 due to an external force or external load having earlier been imposed on proof mass 104 (now 204). The external force or external load exerted on proof mass 104 can have caused proof mass 204 to be set in motion around one or more axes (e.g., x-axis, y-axis, and/or z-axis).

In the embodiment depicted in FIG. 2, proof mass 204 can have been set in motion, by the external force or external load in the y-axis, such that proof mass 204 has accelerated to such an extent that it has come in contact with the overtravel stop 202 and more particularly with the approximately planar surface of the first portion 202A of the overtravel stop 202. At this point in time the effects of stiction can come into play since the approximately planar surface of the first portion 202A of the overtravel stop 202 can provide sufficient surface for the motion of proof mass 204 to adhere to the first portion 202A of the overtravel stop 202. Nevertheless and in accordance with the subject disclosure, as the external force or external load about the one or more axes is increased, the proof mass 204 can transition off the first portion 202A on to the second portion 202B of the overtravel stop 202, thereby overcoming the effects of the stiction that can have caused proof mass 204 to adhere to the overtravel stop 202, and eventually releasing (e.g., via an un-zippering/skittering effect) proof mass 204 from the overtravel stop 202.

Figure 3:
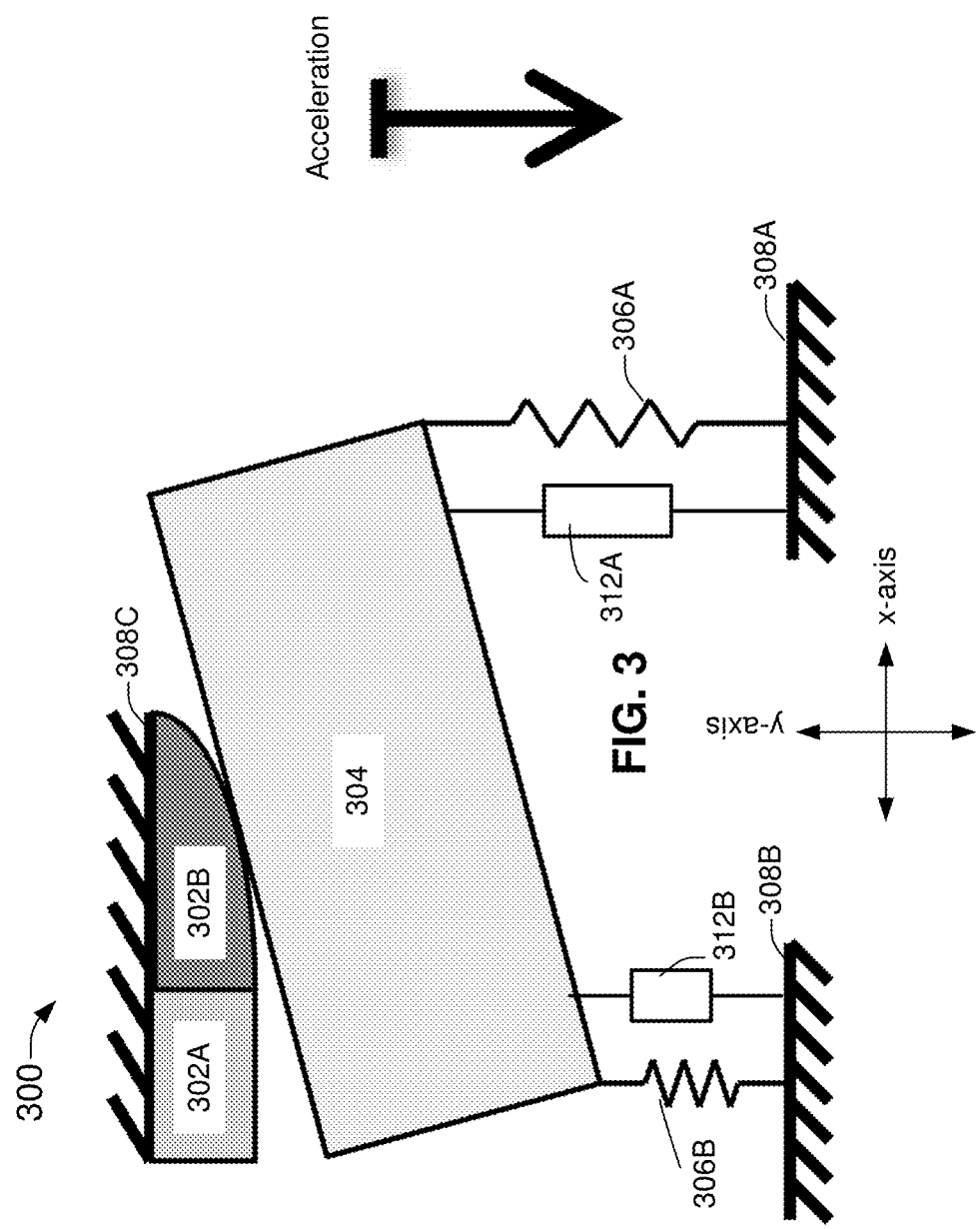
FIG. 3 illustrates provides yet a further illustration of a low stress overtravel stop, in accordance with various embodiments set forth in this disclosure.

In regard to FIG. 2, the first elastic object that stores mechanical energy 106A and the second elastic object that stores mechanical energy 106B illustrated in FIG. 1 are now depicted as first elastic object that stores mechanical energy 206A and second elastic object that stores mechanical energy 206B. Further, first anchor point 108A, second anchor point 108B, and third anchor point 108C are now represented as first anchor point 208A, second anchor point 208B, and third anchor point 208C. For example, as depicted in FIG. 2, a first sensing element or sensing device 212A can be located between proof mass 204 and an anchor point 208A, and a second sensing element or sensing device 212B can be situated between proof mass 204 anchor 208B FIG. 3 provides further depiction of an illustrative embodiment 300 of the low stress overtravel stop 202 that can comprise a first portion 202A and a second portion 202B (now respectively labeled overtravel stop 302, first portion 302A and a second portion 302B). In this embodiment it will be observed that the proof mass 304 has shifted off the substantially planar surface of first portion 302A to the more curvilinear surface of second portion 302B. The cause of the shift of the proof mass 304 from the substantially planar surface of first portion 302A to the more curvilinear surface of second portion 302B can be an increase in the external load imparted to proof mass 304 causing proof mass 304 to accelerate around its axes of rotation. Thus, as the acceleration of the proof mass 304 increase about its axes of rotation, proof mass 304 migrates across the curvilinear surface of the second portion 302B, making point contact with the curvilinear surface as proof mass 304 traverses over the curvilinear face of the second portion 302B until proof mass 304 frees itself from the stiction forces that can have cause proof mass 304 to come in contact with the low stress overtravel stop 302.

Figure 4:
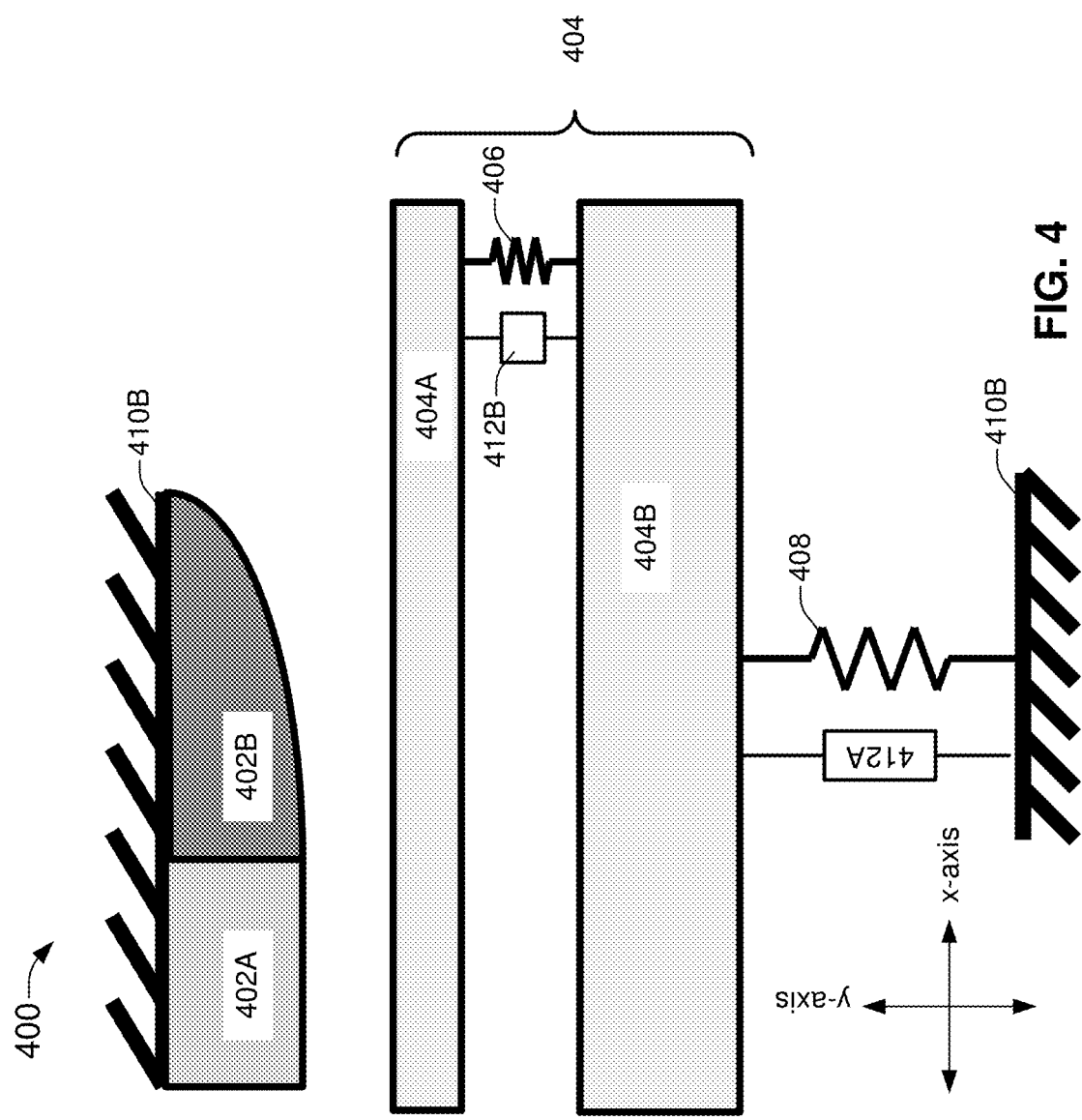
FIG. 4 illustrates another a low stress overtravel stop, in accordance with various embodiments set forth in this disclosure.

In the context of FIG. 3, the first elastic object that stores mechanical energy 206A and the second elastic object that stores mechanical energy 206B illustrated in FIG. 2 are now depicted as first elastic object that stores mechanical energy 306A and second elastic object that stores mechanical energy 306B. Further, first anchor point 208A, second anchor point 208B, and third anchor point 208C are now respectively represented as first anchor point 308A, second anchor point 308B, and third anchor point 308C. For example, as depicted in FIG. 3, a first sensing element or sensing device 312A can be located between proof mass 304 and an anchor point 308A, and a second sensing element or sensing device 312B can be situated between proof mass 304 anchor 308B FIG. 4 provides an additional example embodiment 400 of a low stress overtravel stop comprising a first portion 402A and a second portion 402B. The first portion 402A and the second portion 402B, where necessary, can collectively be referred to as overtravel stop 402. As will be noted by those of ordinary skill, in various embodiments, multiple overtravel stops comprising first portion 402A and second portion 402A can be associated with and/or incorporated within MEMS devices. Further, in various embodiments, overtravel stop 402 can be coupled to an anchor point 410A via various reactive and/or nonreactive adhesive and/or various attachment mechanisms.

As illustrated, overtravel stop 402, like overtravel stop 102 (and overtravel stop 202 and overtravel stop 302)

described and depicted above, can comprise a first portion 402A and a second portion 402B, wherein the first portion 402A can have a surface that has a profile that is substantially planar, and wherein the second portion 402B can have a shaped surface comprising a profile that is substantially curvilinear and that conforms to one or more polynomial function representative of first groups of constant numerical values and second groups of variable numerical values.

Also depicted in FIG. 4 is a proof mass 404 that can comprise a first portion 404A and a second portion 404B. The first portion 404A and second portion 404B can be coupled to one another via a first elastic object that stores mechanical energy, such as a first spring 406. Further, as illustrated, the second portion 404B of proof mass 404 can be coupled to an anchor point 410B via a second elastic object that stores mechanical energy, such as a second spring 408.

In regard to overtravel stop 402 comprising a first portion 402A and second portion 402B, in various embodiments the first portion 402A can have a substantially planar (e.g., flat) surface profile in a direction that is approximately orthogonal to a motion of the proof mass 404 when proof mass 404 is set in motion. For instance, should proof mass 404 is set in motion around a first axis (e.g., x-axis, y-axis and/or z-axis) the substantially planar surface profile of the first portion 402A of overtravel stop 402 can be aligned approximately parallel to the first portion 404A of proof mass 404. For example, as depicted in FIG. 4, a first sensing element or sensing device 412A can be located between a second portion 404B of proof mass 404 and an anchor point 410B, and a second sensing element or sensing device 412B can be situated between a first portion 404A of proof mass 404 and a second portion 404B of proof mass 404.

It will be noted and as depicted in FIG. 4, proof mass 404 when at rest and/or when initially set in motion does not contact with any portion of overtravel stop 402.

Figure 5:
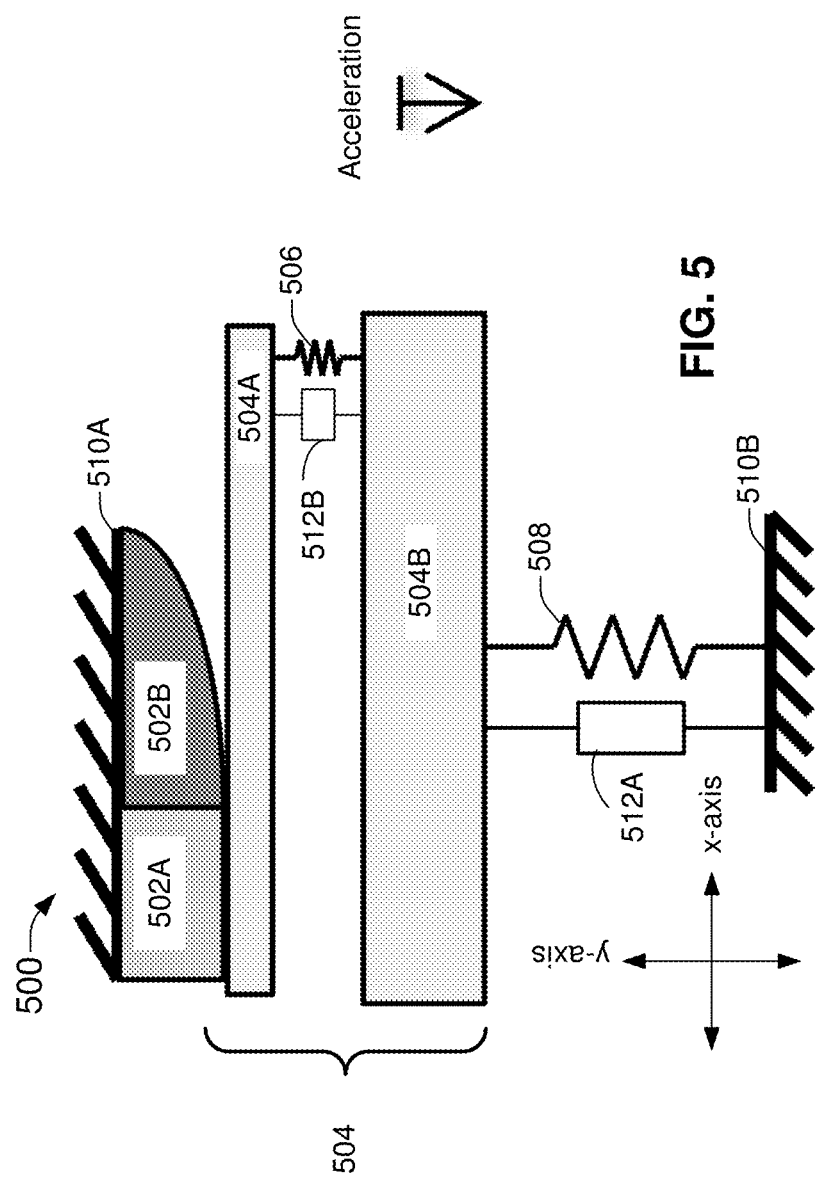
FIG. 5 illustrates a still further low stress overtravel stop, in accordance with various embodiments set forth in this disclosure.

FIG. 5 provides additional illustration of an example embodiment 500 of a low stress overtravel stop 502 comprising a first portion 502A and a second portion 502B. In this depiction the first portion 504A of proof mass 504 has contacted the first portion 502A of overtravel stop 502. The first portion 504A of proof mass 504 can have come in contact with the substantially planar surface of the first portion 502A of overtravel stop 502 due to an external force or external load having been imposed on proof mass 504. The external force or external load exerted on proof mass 504 can have placed proof mass 504 in motion around one or more axes (e.g., x-axis, y-axis, and/or z-axis) and can have accelerated proof mass 502 to such an extent that the first portion 504A of proof mass 504 contacts the substantially planar surface of first portion 502A of the low stress overtravel stop 502.

When the first portion 504A of proof mass 504 contacts the substantially planar surface of first portion 502A of the low stress overtravel stop 502, the effects associated with stiction can come into play as the substantially planar surface of first portion 502A can provide sufficient surface to the first portion 504A of proof mass 504 to cause proof mass 504 to adhere to the substantially planar surface of first portion 502A. For example, as depicted in FIG. 5, a first sensing element or sensing device 512A can be located between a second portion 504B of proof mass 504 and an anchor point 510B, and a second sensing element or sensing device 512B can be situated between a first portion 504A of proof mass 504 and a second portion 504B of proof mass 504.

Figure 6:
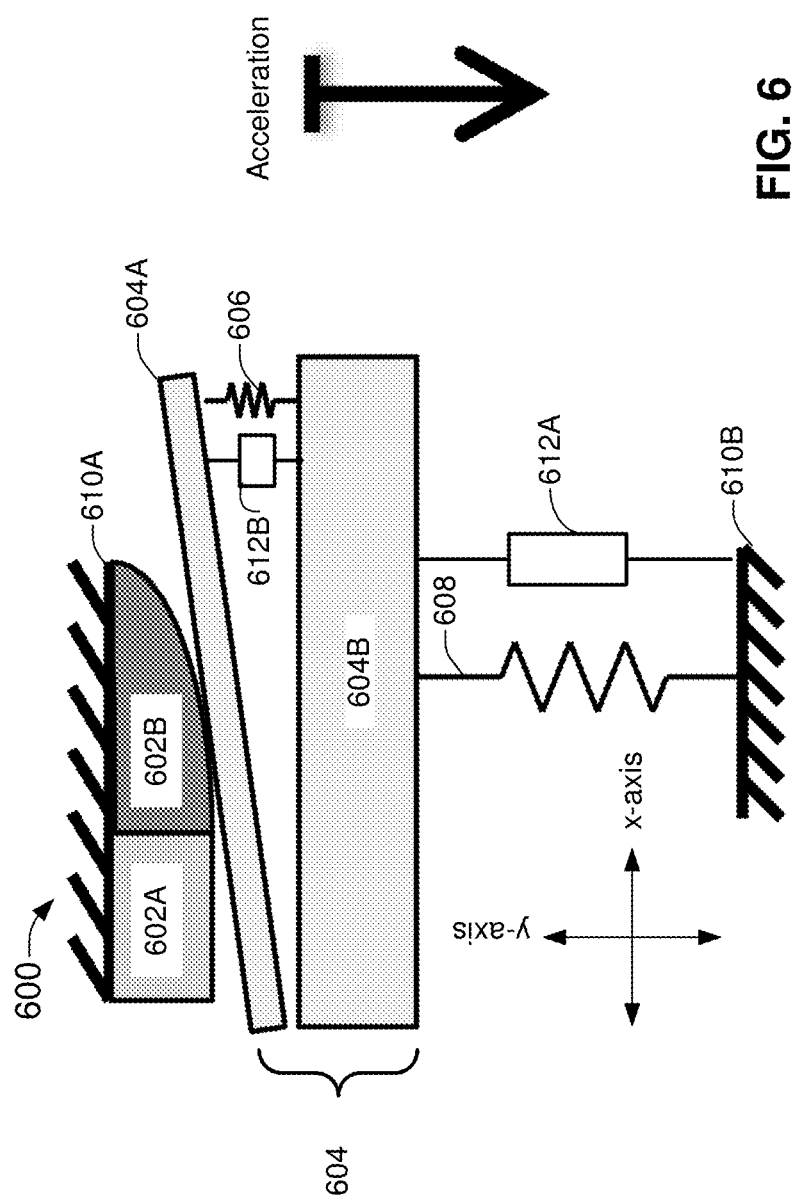
FIG. 6 illustrates an additional low stress overtravel stop, in accordance with various embodiments set forth in this disclosure.

Nevertheless, as is illustrated in FIG. 6, as the external force or external load about the one or more axes is increased, the first portion 504A of proof mass 504 can gradually transition from the substantially planar first portion 502A of the low stress overtravel stop 502 to more curvilinear surface of the second portion 502B of the low stress overtravel stop 502, thereby overcoming and releasing proof mass 502 from the stiction forces associated with the low stress overtravel stop 502.

In the context of FIG. 5 in relation to FIG. 4, it should be observed that the first spring 406 and the second spring 408 have been relabeled as first spring 506 and the second spring 508. Similarly, anchor point 410A and anchor point 410B are relabeled as anchor point 510A and anchor point 510B.

FIG. 6 provides further illustration of an example embodiment 600 of a low stress overtravel stop 602 comprising a first portion 602A and a second portion 602B. In this depiction the first portion 604A of proof mass 604, as a function of additional external forces or additional external loads having been imposed on proof mass 604 around one or more rotational axes (e.g., x-axis, y-axis, and/or z-axis), has transitioned from the first portion 602A of overtravel stop 602 to the more curvilinear second portion 602B of overtravel stop 602. First portion 604A of proof mass 604 by transitioning to the more curvilinear second portion 602B of overtravel stop 602 can now be in point contact with overtravel stop 602. Further, the first portion 604A of proof mass 604, by transitioning to the more curvilinear second portion 602B of overtravel stop 602, can tilt toward the second portion 604B of proof mass 604. The point of contact by the first portion 604A with the more curvilinear second portion 602B of overtravel stop 602 can be determined by differentiating the one or more polynomial function that can have been employed in forming the surface of the curvilinear second portion 602B of overtravel stop 602. Ultimately, when sufficient external forces or additional external loads have been imposed on proof mass 604 around one or more rotational axes, the first portion 604A of proof mass 604 can free itself off overtravel stop 602 entirely. For example, as depicted in FIG. 6, a first sensing element or sensing device 612A can be located between a second portion 604B of proof mass 604 and an anchor point 610B, and a second sensing element or sensing device 612B can be situated between a first portion 604A of proof mass 604 and a second portion 604B of proof mass 604.

In regard to FIG. 6 in relation to FIG. 5, the first spring 506 and the second spring 508 are now represented as first spring 606 and the second spring 608. Similarly, anchor point 510A and anchor point 510B are now depicted as anchor point 610A and anchor point 610B.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above-described components, devices, systems and the like, the terms (including reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified subcomponents, some of the specified components or subcomponents, and/or additional components, and according to various permutations and combinations of the foregoing. Subcomponents can also be implemented as components communicatively coupled to other components rather than included within parent components (hierarchical). Additionally, it should be noted that one or more components may be combined into a single component providing aggregate functionality or divided into several separate subcomponents, and any one or more middle layers, may be provided to communicatively couple to such subcomponents in order to provide integrated functionality. Any component described herein may also interact with one or more other components not specifically described herein.

In addition, while a particular feature of the subject disclosure may have been disclosed with respect to only one of the several implementations, such feature may be combined with one or more other features of the other implementations as may be desired and advantageous for any given or particular application. Furthermore, to the extent that the terms "includes," "including," "has," "contains," or variants thereof, and other similar words are used in either the detailed description or the claims, these terms are intended to be inclusive in a manner similar to the term "comprising" as an open transition word without precluding any additional or other elements.

What is claimed is:

1. A microelectromechanical system device, comprising:
   a proof mass coupled to an anchor via a spring, wherein the proof mass moves in response to an imposition of an external load to the proof mass; and
   an overtravel stop comprising a first portion and a second portion, wherein the proof mass contacts the first portion of the overtravel stop and the proof mass becomes disengaged from the second portion of the overtravel stop in response to the external load being above a first threshold value and below a second threshold value, and wherein the first portion of the overtravel stop is contiguous with and abuts the second portion of the overtravel stop.

2. The microelectromechanical system device of claim 1, wherein the proof mass contacts the second portion of the overtravel stop and disengages from the first portion of the overtravel stop in response to the external load exceeding the second threshold value.

3. The microelectromechanical system device of claim 1, wherein the proof mass moves in a first direction in response to the external load being less than a threshold value, and wherein the proof mass moves in a second direction when the external load exceeds the threshold value.

4. The microelectromechanical system device of claim 3, wherein the first direction is a first translation or first rotation, and wherein the second direction is a second translation or a second rotation.

5. The microelectromechanical system device of claim 3, wherein the first direction is orthogonal to the second direction.

6. The microelectromechanical system device of claim 3, wherein the overtravel stop is located on an axis of the second direction.

7. The microelectromechanical system device of claim 3, wherein the proof mass is asymmetric about an axis of the second direction.

8. The microelectromechanical system device of claim 1, wherein the second portion of the overtravel stop is curved and has an aspect ratio greater than 1:5.

9. The microelectromechanical system device of claim 1, wherein a surface of the overtravel stop comprises any of silicon, titanium, germanium, silicon oxide, silicon nitride, tungsten, or titanium nitride.

10. The microelectromechanical system device of claim 5, further comprising a first sensor and a second sensor, wherein the first sensor measures a first motion of the proof mass in the first direction, and wherein the second sensor measures a second motion of the proof mass in the second direction.

11. The microelectromechanical system device of claim 1, wherein the anchor is a first anchor, and wherein the overtravel stop is coupled to a second anchor.

* * * * *